United States Patent
Poelzleithner

(10) Patent No.: US 9,897,156 B2
(45) Date of Patent: Feb. 20, 2018

(54) METHOD FOR FUNCTIONAL TESTING OF A HOLDING BRAKE OF AN ELECTRIC MOTOR

(71) Applicant: B&R INDUSTRIAL AUTOMATION GMBH, Eggelsberg (AT)

(72) Inventor: Andreas Poelzleithner, Tiefgraben (AT)

(73) Assignee: B&R Industrial Automation GmbH, Eggelsberg (AT)

( * ) Notice: Subject to any disclaimer, the term of this patent is extended or adjusted under 35 U.S.C. 154(b) by 33 days.

(21) Appl. No.: 14/391,617

(22) PCT Filed: Jun. 3, 2014

(86) PCT No.: PCT/EP2014/061442
§ 371 (c)(1),
(2) Date: Oct. 9, 2014

(87) PCT Pub. No.: WO2014/206691
PCT Pub. Date: Dec. 31, 2014

(65) Prior Publication Data
US 2016/0003316 A1    Jan. 7, 2016

(30) Foreign Application Priority Data
Jun. 24, 2013 (AT) .................................. 50414/2013

(51) Int. Cl.
*G01R 19/165* (2006.01)
*F16D 66/00* (2006.01)
(Continued)

(52) U.S. Cl.
CPC ................ *F16D 66/00* (2013.01); *G01L 5/28* (2013.01); *G01R 31/34* (2013.01); *H02P 3/04* (2013.01);
(Continued)

(58) Field of Classification Search
CPC ..... G01R 31/343; G01R 31/34; G01R 31/346
(Continued)

(56) References Cited

U.S. PATENT DOCUMENTS 5,343,134 A    8/1994  Wendt et al.
5,936,377 A *  8/1999  Blaschke ............. H02P 21/141
                                              318/807
(Continued)

FOREIGN PATENT DOCUMENTS

CN    1193422      9/1998
CN    102710210    10/2012
(Continued)

OTHER PUBLICATIONS

Ashishraj, Rotating Magnetic Field, http://www.slideshare.net/ASHISHRAJ5/rotating-32660848, El Dept., SRMCEM, Lucknow, p. 1-13, Sep. 12, 2015.*
(Continued)

*Primary Examiner* — Patrick Assouad
*Assistant Examiner* — Douglas X Rodriguez
(74) *Attorney, Agent, or Firm* — Greenblum & Bernstein, P.L.C.

(57) ABSTRACT

Method for functional testing of a holding brake of an electric motor. Method includes applying, while the holding brake is closed, phase currents to the electric motor in magnitude and angle for producing a current vector; varying, while the holding brake is closed, the phase currents so as to rotate the current vector to be normal to a rotor flux direction at least one time; and checking whether the holding brake slips when the phase currents are being applied.

4 Claims, 4 Drawing Sheets

(51) Int. Cl.
*G01L 5/28* (2006.01)
*H02P 3/04* (2006.01)
*G01R 31/34* (2006.01)
*F16D 121/24* (2012.01)

(52) U.S. Cl.
CPC .... *F16D 2066/003* (2013.01); *F16D 2121/24* (2013.01)

(58) Field of Classification Search
USPC .................................................... 324/765.01
See application file for complete search history.

(56) References Cited

U.S. PATENT DOCUMENTS

| | | | |
|---|---|---|---|
| 6,651,494 B1* | 11/2003 | Herterich | F16D 55/02 73/130 |
| 7,102,314 B2 | 9/2006 | Hayashi | |
| 2005/0069697 A1 | 3/2005 | Goecke | |
| 2007/0031131 A1* | 2/2007 | Griffitts | H02P 6/18 388/811 |
| 2013/0154522 A1 | 6/2013 | Verheyen et al. | |

FOREIGN PATENT DOCUMENTS

| | | |
|---|---|---|
| CN | 102742147 | 10/2012 |
| CN | 202676335 | 1/2013 |
| DE | 197 56 752 | 6/1999 |
| DE | 10 2005 015 608 | 10/2006 |
| DE | 10 2007 005 827 | 8/2008 |
| EP | 1 215 472 | 6/2002 |
| JP | 2005-229661 | 8/2005 |

OTHER PUBLICATIONS

Baumgartner, et al., DE 19756752, Also published as: EP0924583 (A3), mechanical translation, p. 1-11, Sep. 2, 2015.*
Boylestad, Robert, Introductory Circuit Analysis, $5^{th}$ edition, Merrill Pub. Co., 1987, Chapter 22, p. 719-726.*
Liu, Jaining, CN 202676335, 2013, Machine Translation.*
International Search Report (PCT/ISA/210) conducted in Int'l Appln. No. PCT/EP2014/061442 (dated Aug. 25, 2014).
Written Opinion of International Searching Authority (PCT/ISA/237) conducted in Int'l Appln. No. PCT/EP2014/061442 (dated Aug. 25, 2014) (in German; in English).
English Translation of China Office Action Conducted in China Appln. No. 2014800001512.8 (dated Oct. 31, 2016).

* cited by examiner

METHOD FOR FUNCTIONAL TESTING OF A HOLDING BRAKE OF AN ELECTRIC MOTOR

The subject invention relates to a method for functional testing of a holding brake of an electric motor in which, with the holding brake closed, phase currents are applied to the electric motor in magnitude and angle for producing a current vector and it is checked whether the holding brake slips when the phase currents are being applied.

In many machines, moved machine parts are driven by electric motors. Often, holding brakes are also provided in order to fix a moved axis of the machine in place. The holding brake may be embodied as a separate component, or it may also be integrated into the electric motor. The function of the holding brake, especially in safety-critical areas, must be ensured in order to prevent injuries to people and damage to the machine. However, the holding brake is subject to wear, e.g. of the brake linings, which change the behavior of the brake. Apart from this, the function of the holding brake may be negatively impacted by external soiling, e.g. by oil, or by damage. Therefore regular functional tests of the holding brake are necessary, e.g. at regular time intervals or always prior to a certain movement of the machine, in order to ensure that the holding brake can still produce adequate brake action. If the holding brake does not pass the functional test, as a rule the machine is stopped.

To this end, DE 10 2005 015 608 A1 suggests a method in which the electric motor of the driven axis is controlled with a torque and via the position sensor of the drive there is a check of whether the holding brake is able to hold the torque. If the holding brake slips, this is interpreted as failure of the holding brake. To this end, the torque is increased in increments until the holding brake slips and the last held torque is considered to be the maximum holding force of the holding brake and may be compared to defined nominal holding force.

DE 10 2007 005 827 A1 describes a method for a functional test of a holding brake of an electric motor that moves a suspended load. In order to be able to take the load into account during the functional test, in this case the effect of the load is first determined in that the electric motor is activated such that the load remains unmoved with an open brake. The motor current necessary for this is stored as a reference value. Then the electric motor is activated, with the brake closed, at a multiple of this reference number and an angle sensor checks to see whether the drive is moving.

DE 197 56 752 A1 also describes a functional test of a holding brake in which, with the holding brake closed, a starting current is applied that causes a certain torque. Rotation of the rotor of the electric motor and thus an abnormal holding brake may be detected by determining the motor voltage or by means of a rotary encoder.

In this prior art, with the holding brake closed, a motor current is then applied in order to cause a certain torque. However, in particular in multiphase electric motors, the motor current in a held electric motor must be applied correctly in a vector (in magnitude and angle) in order to produce the expected torque. The stator current results from the vector addition of the individual phase currents and is known as current vector $i_s$. Using the known Clarke or Park transformation, the current vector may be transformed to the stator fixed $\alpha$ $j\beta$ coordinate system or to the rotor fixed dq coordinate system. For the Park transformation, the absolute position of the rotor relative to the stator is required, and as a rule is measured with an angle measuring device. When using the rotor fixed coordinate system dq, it is assumed that the current vector in the rotor fixed dq coordinate system has exclusively one torque forming q component (normal to the rotor flux direction d). This is ensured by the drive control so that the stator current rotates with the rotor fixed dq coordinate system.

However, because of faulty commutation, errors in the motor control, or errors in the drive control, the actual current vector may also contain a d component. This means that the q component is less than the magnitude of the current vector, so that the torque is lower in magnitude than assumed or specified. With respect to the brake test, however, this means that it cannot be assumed that the applied stator current or the applied phase currents that can be measured or are known is proportional to the torque on the motor shaft unless the commutation is correct and unless there is no error.

E.g., an angle error $v_{err}$ between the actual rotor fixed d'q' coordinate system (d' is in the flux direction of the rotor) and the assumed dq coordinate system must be assumed. For a permanent magnet excited synchronous motor in vector regulation,
$M = K_T i_s \cos v_{err}$. Ideally
$v_{err} = 0$ and thus the torque M is directly proportional to the torque-forming current portion (stator current) due to the motor constant $K_T$. However, if there is an error, $v_{err} \approx 0$, so that a lower torque results. This means that a brake test for functional testing of a holding brake based on the measured phase currents or the current vector $i_s$ resulting therefrom as in the prior art is not adequately reliable.

It is therefore an object of the subject invention to improve the reliability of a functional test of a holding brake of an electric motor.

This object is inventively attained in that the phase currents are varied so that the current vector is rotated, with the holding brake closed, so that the current vector is normal to the rotor flux direction at least one time. In this manner it is may be guaranteed that the desired torque is actually applied at least one time for the functional testing of the holding brake.

In the simplest case, when no external load is applied, it is sufficient when the current vector is rotated by an angle of at least 180°. If there is an external load or a functional test with a torque in a certain direction, the current vector is rotated about an angle of at least 360°.

For the functional testing, it is advantageous when the electric period is divided into sectors and during the functional testing the current vector remains in each sector for a defined dwell period, since in this way it is possible to ensure that the torque that is to be adjusted actually does adjust.

The subject invention is explained in greater detail in the following, using FIGS. 1 through 8, which depict exemplary, schematic, and non-limiting advantageous embodiments of the invention.

Figure 1:
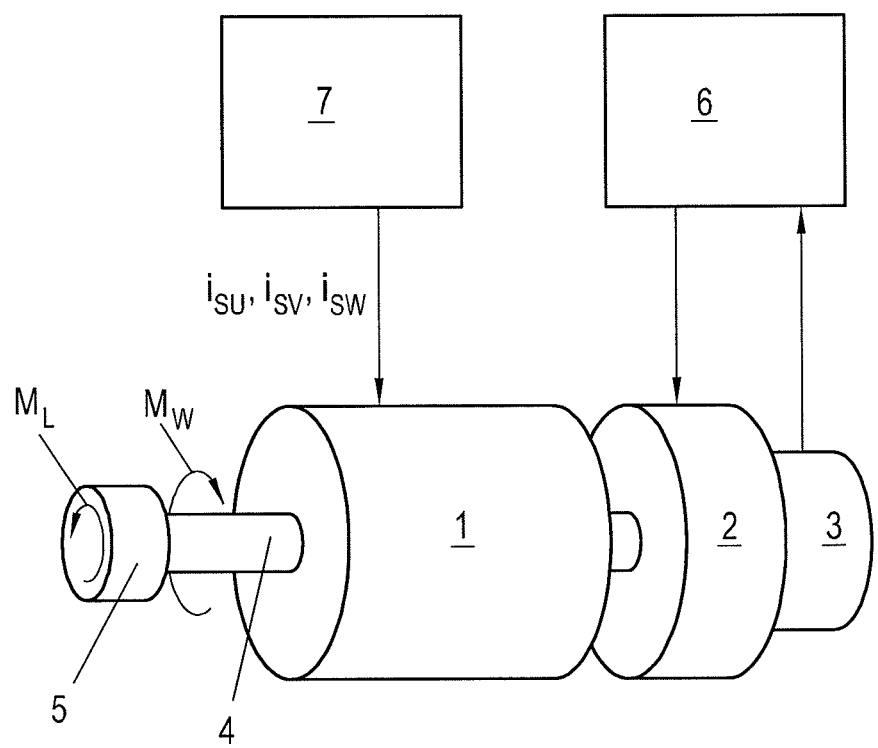
FIG. 1 depicts a typical drive with electric motor, load, and holding brake.

FIG. 1 is a schematic depiction of a drive with an electric motor 1 that is connected to al load 5 via a motor shaft 4. The electric motor 1 produces a torque $M_W$ on the motor shaft 4 and the load 5 produces a load moment $M_L$. A holding brake 2 in any desired embodiment is arranged on the motor shaft 4; in this case it is at the other end of the electric motor 1. Likewise, a rotary encoder 3 is provided for measuring the rotational angle. Naturally, the axial arrangement of electric motor 1, holding brake 2, and rotary encoder 3 may be modified as desired. Likewise, it is possible for the holding brake 2 and/or the rotary encoder 3 to be integrated in the electric motor 1, but they may also be mechanically attached in another manner, e.g. via a gear unit.

Figure 2:
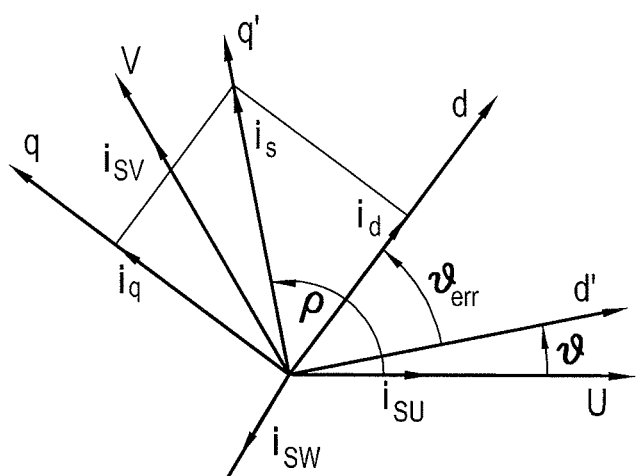
FIG. 2 depicts the current vector that results when phase currents are applied.

A motor control 6 controls the electric motor 1 via the power electronics unit 7, which as a rule is an inverted rectifier. To this end, e.g. a torque $M_W$ may be prespecified by the motor control 6 and then may be converted by the power electronics unit 7 to phase currents $i_{su}$, $i_{sv}$, $i_{sw}$ for producing the torque $M_W$. The phase currents $i_{su}$, $i_{sv}$, $i_{sw}$ produce a current vector $i_s$ in magnitude and angle $\rho$, as is described in greater detail using FIG. 2.

Ideally the current vector $i_s$ should equal the torque-forming current component $i_q$ in the rotor fixed coordinate system dq in magnitude and angle, that is, $i_s=i_q$. Due to errors, however, there is an error (coordinate system d'q') that leads to the stator current $i_s$ also containing a d component $i_d$. Thus $i_q=i_s \cos(\vartheta_{err})$, and the torque-forming current component $i_q$ and therefore also the torque $M_W$, which is produced by the electric motor 1 and is applied to the motor shaft 4, is smaller than expected based on the applied or measured phase currents $i_{su}$, $i_{sv}$, $i_{sw}$.

Figure 3:
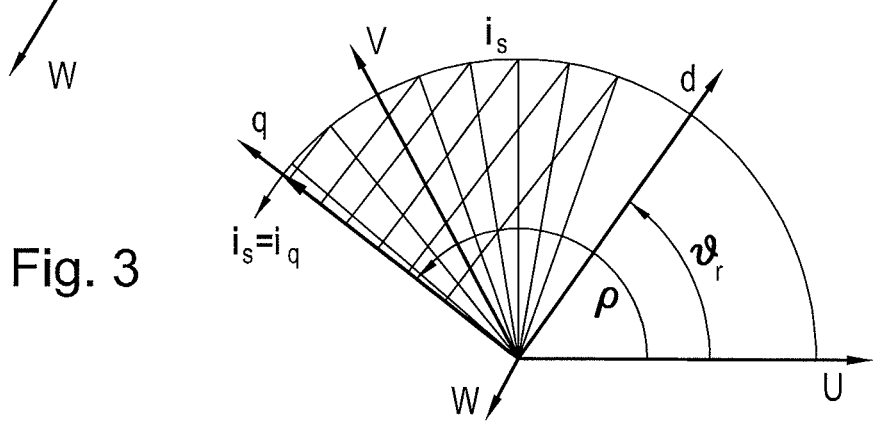
FIG. 3 and FIG. 4 depict the rotation of the current vector.

In order to take this into account for the functional test of the holding brake 2, it is now provided that the current vector $i_s$ is rotated, e.g. using appropriate variation of the phase currents $i_{su}$, $i_{sv}$, $i_{sw}$ with the holding brake 2 closed, so that it is ensured that the current vector $i_s$ points exclusively in the q direction (normal to the rotor flux direction d) at least once and consequently $i_s=i_q$ at least once, as illustrated in FIG. 3.

Moreover, two cases may be differentiated, specifically a brake test without an external load and a brake with an external load (as indicated in FIG. 1 in the form of load moment $M_L$).

Figure 4:
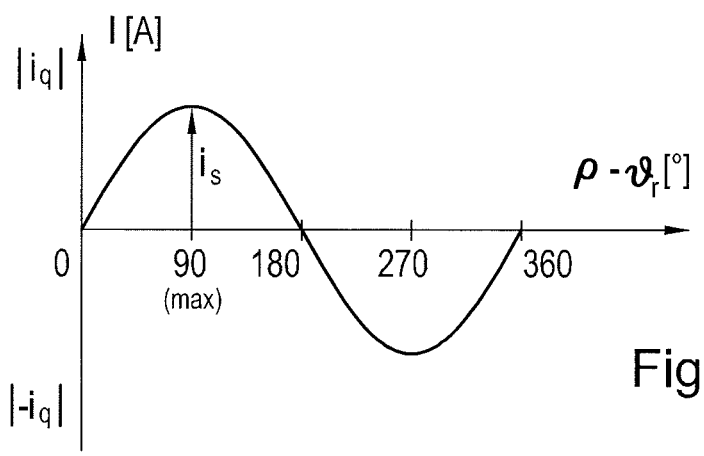

In the brake test without an external load, it is sufficient for the current vector to be rotated by 180° if the direction of the load is irrelevant in order to ensure that the current vector $i_s$ points exclusively in the q direction at least once, as may be seen in FIG. 4. However, if the holding brake 2 is tested with a torque in a specific direction, in this case the current vector $i_s$ must also be rotated by 360° in order to reliably test the function of the holding brake 2.

In the exemplary embodiment according to FIG. 4, the stator current $i_s$ is rotated e.g. by 360° and is projected onto the q axis of the rotor fixed coordinate system dq in the form $i_q=|i_s|\sin(\rho-\vartheta_r)$. Thus the torque-forming current component $i_q$ attains the maximum $i_s=i_q$ at least one time, so that the intended torque $M_W=K_T i_s$ is produced at least one time for testing the holding brake 2.

Figure 5:
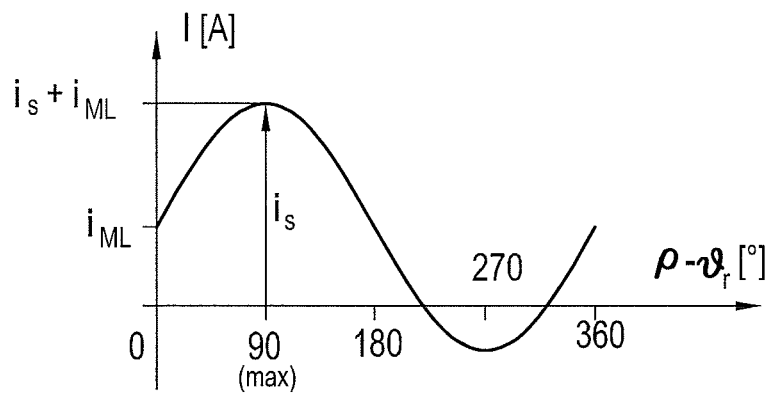
FIG. 5 depicts the rotation of the current vector when there is an external load.

If an external load 5 that causes a certain load moment $M_L$ is also connected to the drive, the holding brake 2 is already experiencing a base load. This base load may be expressed as moment-equivalent current $I_{ML}$. The torque that the drive must produce during the braking test is reduced by this amount. The moment-equivalent current path $i_{Test}$ from the perspective of the holding brake 2 is the sum of the external base load $i_{ML}$ and the moment-forming portion of the stator current $i_q$, $i_{Test}=i_{ML}+|i_s|\sin(\rho-\vartheta_{err})$, as shown in FIG. 5. The external load 5 may be pre-specified as known.

If the current vector $i_s$ is rotated by 360°, the torque-forming current component $i_q$ passes through the maximum $i_s=i_q$ at least one time.

For the functional test of the holding brake 2, e.g. using the rotary encoder 3, there is a check of whether the holding brake 2 slips while the current vector $i_s$ rotates. If the rotary encoder 3 detects a change in angle that is too great, this is interpreted as the holding brake 2 slipping and the functional test is terminated with an error message, e.g. initiating a status bit. It is possible to pre-specify what change in angle is permissible. The error message may be forwarded, e.g. to the motor control 6, which then can initiate a suitable action, e.g. initiating an emergency stop, notifying a superior system control, signaling the failed functional test, etc. Naturally, the functional test may also be triggered and/or executed by the motor control 6. However, it may also be provided that the functional test is executed by a different unit, e.g. a reliable motor control.

Figure 6:
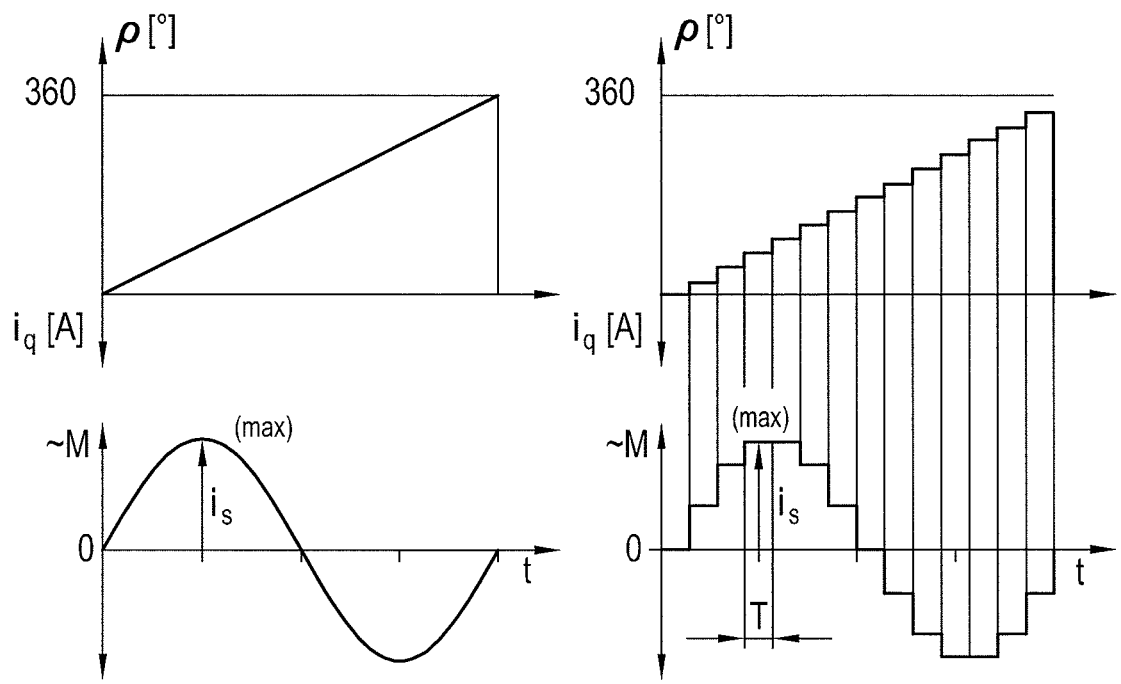
FIG. 6 depicts a quasi-continuous and discrete rotation of the current vector; and, FIG. 7 and FIG. 8 depict the division of the electric period into sectors.
Figure 7:
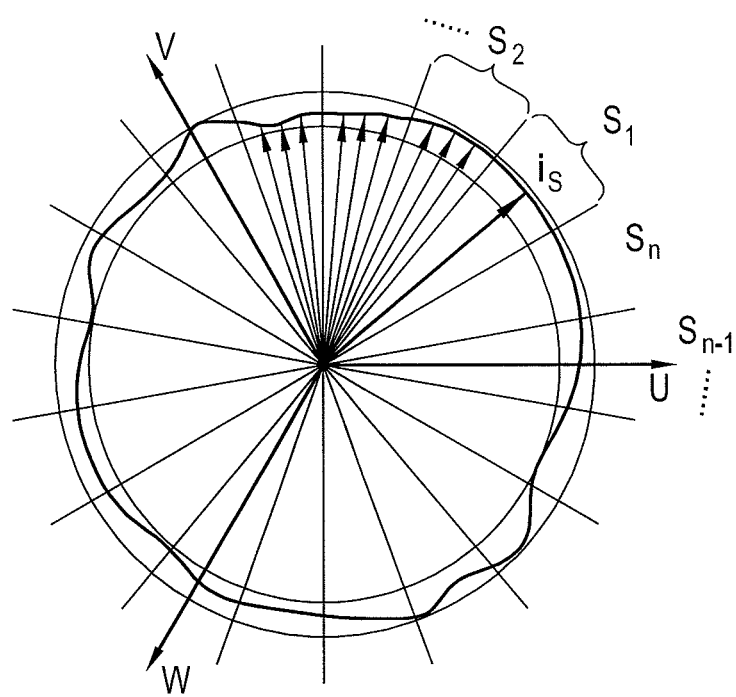

For specific implementation of the functional test described above, the angle $\rho$ of the current vector $i_s$ may be changed in semi-continuous steps or in discrete steps, as depicted in FIG. 6 and FIG. 7.

Figure 8:
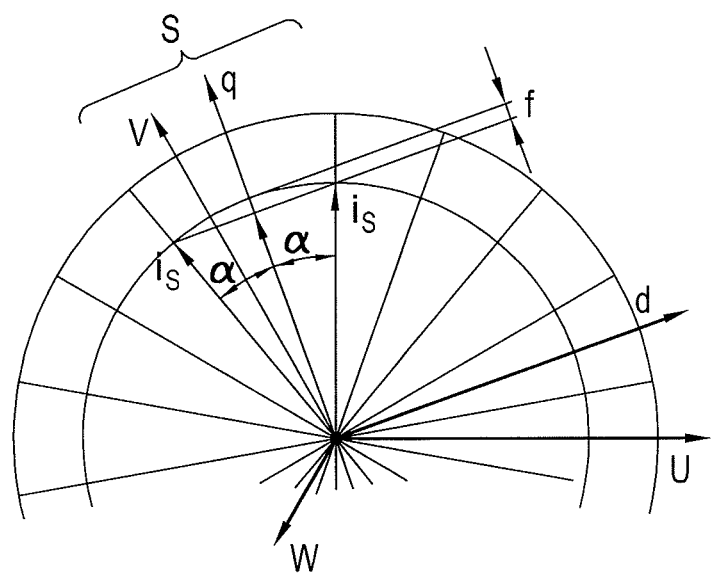

To this end, the electrical period (360°) is divided into n sectors $S_n$, e.g. 18 sectors as depicted in FIG. 7. For the brake test it is now provided that the current vector $i_s$ for a valid functional test must remain in each sector $S_n$ for a certain dwell period so that the torque $M_W$ can adjust. The sector size or the number of sectors may be determined from a maximum tolerable error f, as explained using FIG. 8. Thus, for the sector size $\alpha$, $\alpha=\pm\arccos(1-f/100)$, wherein f is given in a percent.

It can thus be guaranteed that the maximum torque is applied in a sector $S_n$ during the dwell period, less the error f, which is a function of the sector size $\alpha$. The smaller the dividing sectors $S_n$ are, the lower the maximum error f is, but at the same time this also increases the total test time, since the current vector $i_s$ must dwell in each sector $S_n$. Thus a reasonable compromise must be found between precision and testing time.

The required dwell time is a function of the application and the holding brake 2 that is used and must either be adjusted using the manufacturer instructions or in-house calculation and is the responsibility of the user. The same applies to the tolerance window for the change of angle.

The moment equilibrium and the tolerated angle change tolerance may be used as a starting point for the calculation. With these values it is possible to calculate how long a torque must be applied in order to accelerate the inertia of the rotor of the electric motor 1, and where necessary of a load 4, in order to cover the minimum measurable change in angle.

Moreover, when there is an external load 5 it may be provided that the load moment $M_L$ that brings the external load 5 to a standstill is determined, e.g. using a method as described in DE 10 2007 005 827. The load moment $M_L$ may also be specified as known for many applications. Now a current vector $i_s$ may be set that corresponds to the moment-equivalent current $I_{ML}$ of the load moment $M_L$ and the resulting torque may be measured, or it may be checked whether the external load with this set current vector $i_s$ is at a standstill. The commutation or the torque constant $K_T$ can thus be checked for plausibility, e.g. using the comparison of the known external load 5 or the load moment $M_L$ to the measured torque, i.e. in this manner it is possible to detect faulty commutation if the two torques deviate from one another.

The above also applies in like manner for a linear motor, since from a control engineering perspective there is no difference between a rotating motor and a motor in a linear embodiment. It is possible to imagine the linear motor as an "unwound" motor. As a rule, the three windings (phases) are (short stator motor) arranged adjacent to one another in the slide and produce a sinusoidal "electric loading" (magnetic flux) in the air gap. The permanent magnets are disposed arranged adjacent to one another in the fixed part of the motor. It is just the opposite in the long stator motor. An electrical revolution corresponds to the pool pair length and is converted internally so that in this case as well there is a "rotation of the current vector." Ideally the current vector is again semi-normal to the flow direction. The torque constant here is equivalent to a force constant and the linear motor does not produce torque M but rather produces a force F. The method for functional testing of a holding brake may therefore be used in an identical and equivalent manner even in the case of a linear motor.

The invention claimed is:

1. Method for functional testing of a holding brake of an electric motor comprising:

controlling, while the holding brake is closed, phase currents applied to the electric motor to produce a torque, the phase currents producing a current vector in magnitude and angle;

controlling the applied phase currents, while the holding brake remains closed, so as to rotate the current vector to be normal to a rotor flux direction at least one time; and checking whether the closed holding brake slips as the applied phase currents are being controlled.

2. Method in accordance with claim 1, wherein the applied phase currents are controlled so that the current vector rotates by an angle of at least 180°.

3. Method in accordance with claim 1, wherein the applied phase currents are controlled so that the current vector rotates by an angle of at least 360°.

4. Method in accordance with claim 1, wherein the electrical period is divided into sectors and during the functional testing the current vector remains in each sector for a defined dwell period.

* * * * *